(12) United States Patent
Minesaki

(10) Patent No.: US 10,497,618 B2
(45) Date of Patent: Dec. 3, 2019

(54) SEMICONDUCTOR DEVICE AND SEMICONDUCTOR CHIP

(71) Applicant: LAPIS SEMICONDUCTOR CO., LTD., Kanagawa (JP)

(72) Inventor: Fujiyuki Minesaki, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/636,671

(22) Filed: Jun. 29, 2017

(65) Prior Publication Data

US 2018/0005888 A1 Jan. 4, 2018

(30) Foreign Application Priority Data

Jul. 4, 2016 (JP) .................. 2016-132628

(51) Int. Cl.
*H01L 21/768* (2006.01)
*H01L 21/304* (2006.01)
(Continued)

(52) U.S. Cl.
CPC .... *H01L 21/76898* (2013.01); *H01L 21/3043* (2013.01); *H01L 23/31* (2013.01); *H01L 23/3121* (2013.01); *H01L 23/481* (2013.01); *H01L 23/49575* (2013.01); *H01L 23/49596* (2013.01); *H01L 23/49811* (2013.01); *H01L 23/50* (2013.01); *H01L 25/50* (2013.01); *H01L 23/525* (2013.01); *H01L 2224/05554* (2013.01); *H01L 2224/06* (2013.01); *H01L 2224/48137* (2013.01); *H01L 2224/48247* (2013.01)

(58) Field of Classification Search
None
See application file for complete search history.

(56) References Cited

U.S. PATENT DOCUMENTS 5,029,267 A * 7/1991 Masuda ................. H03B 5/326
331/107 A
5,302,921 A * 4/1994 Shigemori ............... H03B 1/04
257/307

(Continued)

FOREIGN PATENT DOCUMENTS

JP 2004165429 A 6/2004
JP 2005033761 A 2/2005

*Primary Examiner* — Nishath Yasmeen
(74) *Attorney, Agent, or Firm* — Volentine, Whitt & Francos, PLLC

(57) ABSTRACT

A semiconductor device includes a semiconductor chip including a circuit having a predetermined function, at least one first terminal connected to the circuit, and plural second terminals not connected to the circuit, the first and second terminals being formed along one edge of the semiconductor chip; plural third terminals provided at positions outside of the semiconductor chip and opposing the one edge, each of the plural third terminals being connected to one of the plural second terminals by a respective first wire; and an electronic component provided between the semiconductor chip and the third terminals, the electronic component including a fourth terminal that is connected to the first terminal by a second wire and is disposed below some of the first wires, wherein the first terminal is disposed at a position such that the first and second wires do not intersect.

8 Claims, 5 Drawing Sheets

(51) Int. Cl.
  *H01L 23/31*      (2006.01)
  *H01L 23/48*      (2006.01)
  *H01L 23/498*     (2006.01)
  *H01L 23/50*      (2006.01)
  *H01L 25/00*      (2006.01)
  *H01L 23/495*     (2006.01)
  *H01L 23/525*     (2006.01)

(56) References Cited

U.S. PATENT DOCUMENTS

| | | | | |
|---|---|---|---|---|
| 5,608,359 | A  * | 3/1997  | Knecht    | H03L 1/028 |
| | | | | 331/68 |
| 5,912,592 | A  * | 6/1999  | Kikushima | H03H 9/0542 |
| | | | | 331/158 |
| 6,232,846 | B1 * | 5/2001  | Hirano    | G01R 31/2824 |
| | | | | 331/107 A |
| 6,291,898 | B1 * | 9/2001  | Yeh       | H01L 23/3128 |
| | | | | 257/690 |
| 6,320,201 | B1 * | 11/2001 | Corbett   | G01R 31/2856 |
| | | | | 257/202 |
| 6,538,264 | B2 * | 3/2003  | Corbett   | G01R 31/2856 |
| | | | | 257/202 |

* cited by examiner

SEMICONDUCTOR DEVICE AND SEMICONDUCTOR CHIP

CROSS-REFERENCE TO RELATED APPLICATION

This application claims priority under 35 USC 119 from Japanese Patent Application No. 2016-132628, filed on Jul. 4, 2017, the disclosure of which is incorporated by reference herein.

BACKGROUND

Technical Field

The present disclosure relates to a semiconductor device and a semiconductor chip.

Related Art

Semiconductor devices are known in which a semiconductor chip and electronic components that is connected to the semiconductor chip are mounted on a lead frame.

For example, Japanese Patent Application Laid-Open (JP-A) No. 2004-165429 discloses a semiconductor device in which a semiconductor chip and passive elements are fixed to a lead frame. In the above disclosure, the passive elements in the semiconductor device are manufactured separately from the lead frame and are fixed to the lead frame.

In addition, JP-A No. 2005-033761 discloses a piezoelectric oscillator that includes a oscillator package in which a piezoelectric oscillator element is housed, and a semiconductor element including an oscillator circuit electrically connected to the oscillator package. In this piezoelectric oscillator, the oscillator package and the semiconductor element are respectively fixed to mutually distinct faces of an island portion of the lead frame.

As a configuration for a semiconductor device in which a semiconductor chip and electronic components that are connected to the semiconductor chip are mounted on a lead frame, the semiconductor device may be, for example, configured such that the electronic components are disposed between the semiconductor chip and lead terminals, and plural wires connecting the lead terminals and the semiconductor chip are disposed so as to bridge the electronic components. However, in such a configuration, wires connecting the semiconductor chip and the electronic components may contact with wires connecting the semiconductor chip and the lead terminals, in a case in which the semiconductor chip and the electronic components are connected by wires.

SUMMARY

The present disclosure provides, in a semiconductor device that includes a semiconductor chip and electronic components connected to the semiconductor chip, a semiconductor device that may prevent wires connecting the semiconductor chip and the electronic components from contacting with other wires.

A first aspect of the present disclosure is a semiconductor device including: a semiconductor chip including a circuit having a predetermined function, at least one first terminal connected to the circuit, and a plural second terminals not connected to the circuit, the first terminal and the second terminals being formed along one edge of the semiconductor chip; plural third terminals provided at positions outside of the semiconductor chip and opposing the one edge, each of the plural third terminals being connected to one of the plural second terminals by a respective first wire; and an electronic component provided between the semiconductor chip and the third terminals, the electronic component including a fourth terminal that is connected to the first terminal by a second wire and is disposed below some of the first wires, wherein the first terminal is disposed at a position such that the first wires and the second wire do not intersect.

A second aspect of the present disclosure is semiconductor chip having a rectangular external profile including: an oscillator circuit; plural terminals provided along one edge forming an outer periphery of the semiconductor chip; and internal wiring that connects one of the plural terminals with the oscillator circuit and that runs through a region between the one of the plural terminals and the one edge of the semiconductor chip.

According to the above aspects, the present disclosure may provide a semiconductor device that may prevent wires connecting a semiconductor chip and electronic components from contacting with other wires, in a semiconductor device that includes the semiconductor chip and the electronic components connected to the semiconductor chip.

BRIEF DESCRIPTION OF THE DRAWINGS

Exemplary embodiments will be described in detail based on the following figures, wherein.

DETAILED DESCRIPTION

Figure 1:
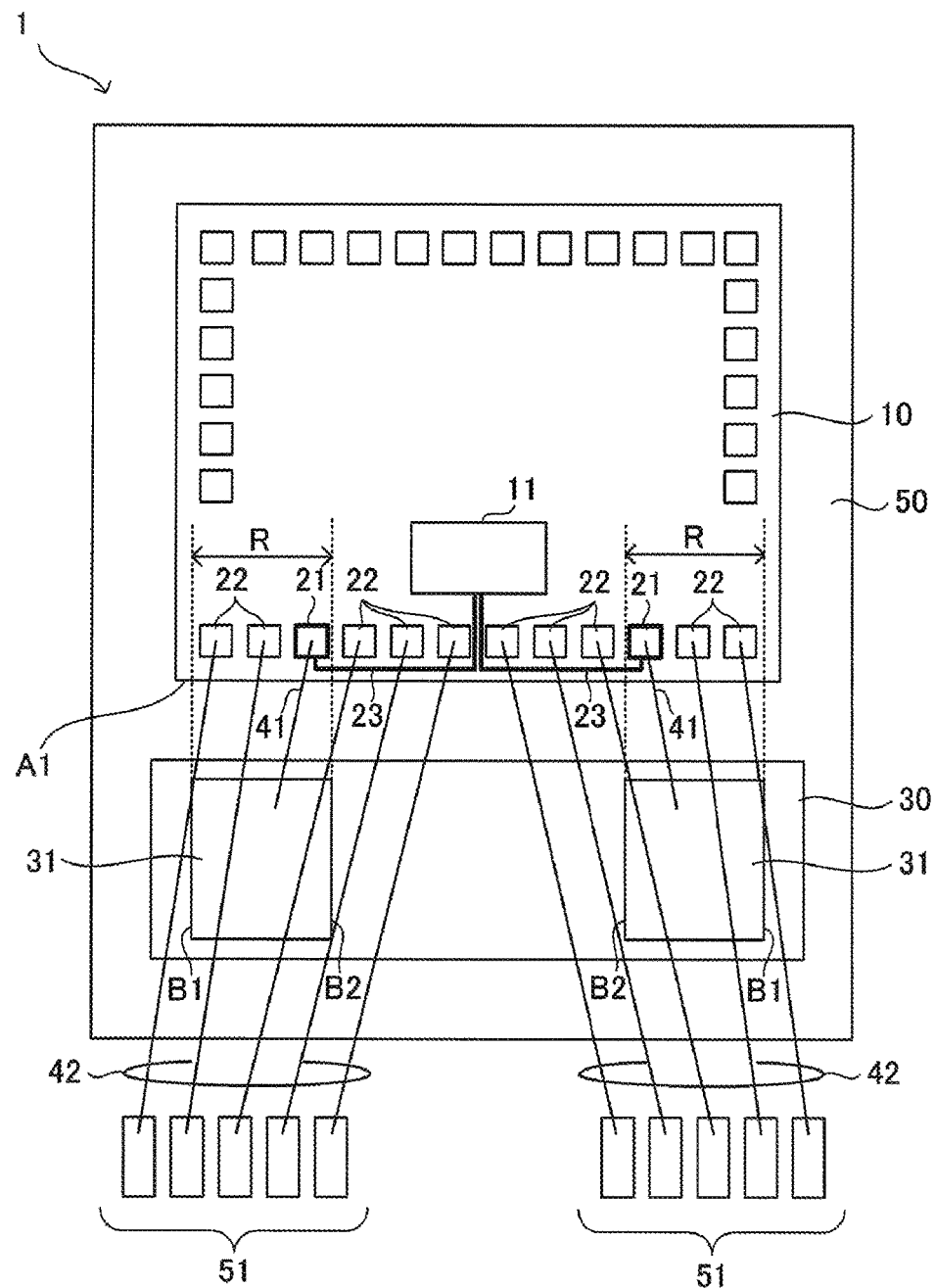
FIG. 1 is a plan view illustrating a configuration of a semiconductor device according to an exemplary embodiment of the present disclosure.

Explanation follows regarding example exemplary embodiments of the present disclosure, with reference to the drawings. Note that in the drawings, configuration elements and portions that are the same or are equivalent are appended with the same reference numerals.

First Exemplary Embodiment

Figure 2:
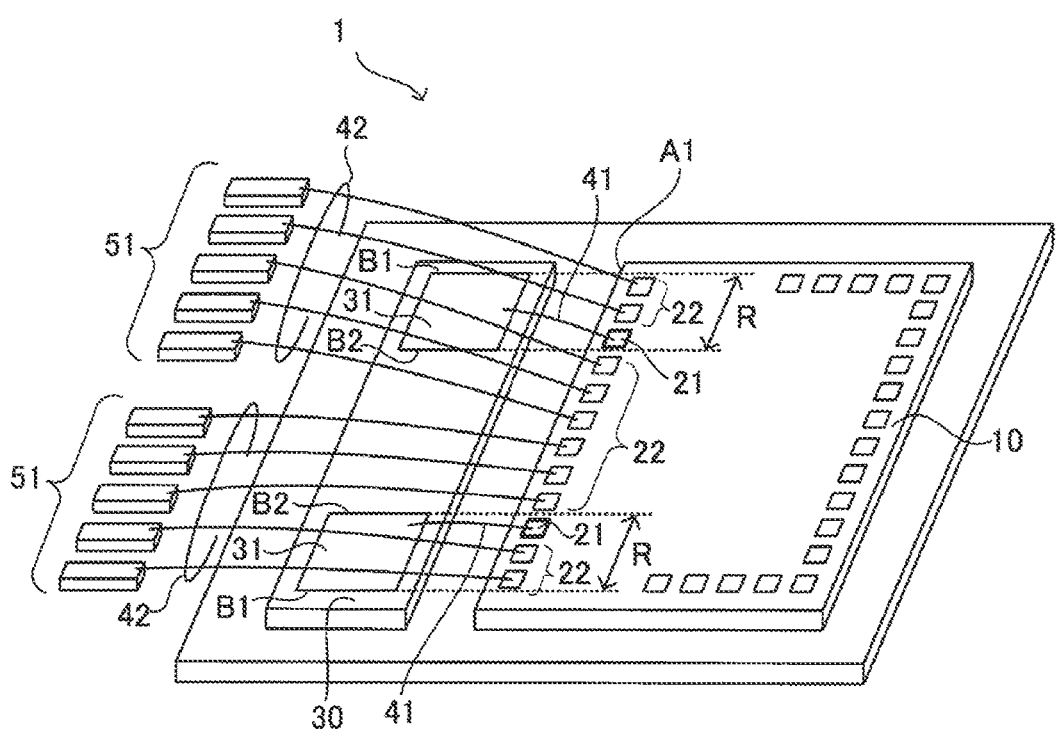
FIG. 2 is a perspective view illustrating a configuration of a semiconductor device according to an exemplary embodiment of the present disclosure.

FIG. 1 is a plan view illustrating a configuration of a semiconductor device 1 according to an exemplary embodiment of the present disclosure, and FIG. 2 is a perspective view of the semiconductor device 1. In the semiconductor device 1, a semiconductor chip 10 and an oscillating element 30 are mounted on a die pad 50 that configures a lead frame. The semiconductor chip 10 has a rectangular external shape, and the semiconductor chip 10 is provided with plural electrode pads along each of the edges forming the outer periphery of the semiconductor chip 10. Plural lead terminals 51 that configure the lead frame are provided at positions opposing one edge A1 of the semiconductor chip 10. The plural lead terminals 51 are arrayed along the edge A1.

The oscillating element 30 is disposed between the plural lead terminals 51 and the semiconductor chip 10.

The semiconductor chip 10 includes an oscillator circuit 11 that is connected to the oscillating element 30. Two electrode pads 21 that are each connected to the oscillator circuit 11, and plural electrode pads 22 that are not connected to the oscillator circuit 11, are provided along the edge A1 of the semiconductor chip 10.

The two electrode pads 21 connected to the oscillator circuit 11 are provided spaced apart from each other. Some of the plural electrode pads 22 that are not connected to the oscillator circuit 11 are disposed between the one and the other of the electrode pads 21. Each of the electrode pads 21 is connected to the oscillator circuit 11 by internal wiring 23 that runs through a region between the edge A1 of the semiconductor chip 10 and the electrode pads 21 and 22, namely, that runs through an outer peripheral region of the semiconductor chip 10. Namely, the internal wiring 23 does not configure a wiring layout that connects the electrode pads 21 and the oscillator circuit 11 by the shortest routes, and the internal wiring 23 configures a wiring layout that diverts along the edge A1 side of the semiconductor chip 10. In other words, the internal wiring 23 connecting the oscillator circuit 11 and the electrode pads 21 configures a wiring layout that passes through the region between two electrode pads 22 disposed between the two electrode pads 21 and that connects to the electrode pads 21. Forming the wiring layout of the internal wiring 23 in such manner may avoid interference between the internal wiring 23 and other wiring formed in the semiconductor chip 10, and may simplify the arrangement of other wiring.

Each of the plural electrode pads 22 not connected to the oscillator circuit 11 is connected to a corresponding lead terminal 51 by a wire 42. Namely, respective wires 42 are disposed so as to bridge the oscillating element 30.

The oscillating element 30 includes, for example, a crystal oscillator. The external profile of the oscillating element 30 is, for example, a rectangular shape, and the longitudinal direction of the oscillating element 30 is disposed so as to face the edge A1 of the semiconductor chip 10. The length of the oscillating element 30 in the longitudinal direction is substantially the same as the length of the semiconductor chip 10, or is longer than the length of the semiconductor chip 10. The oscillating element 30 includes two electrode pads 31 provided on the surface of the oscillating element 30. The two electrode pads 31 are spaced apart from each other along the longitudinal direction (the direction along the edge A1) of the oscillating element 30. Each of the electrode pads 31 is disposed at a longitudinal direction end portion of the oscillating element 30. The size of each of the electrode pads 31 is sufficiently larger than the size of the electrode pads 21 and 22 formed on the semiconductor chip 10. Each of the two electrode pads 31 is disposed below the wires 42. In FIG. 1 and FIG. 2, extension lines from mutually opposing edges B1 and edges B2 of the electrode pads 31 of the oscillating element 30 are illustrated by dashed lines. The two electrode pads 21 connected to the oscillator circuit 11 are each provided within a region R, which is a region between the edge B1 extension line and the edge B2 extension line of the respective electrode pad 31. Namely, the two electrode pads 21 connected to the oscillator circuit 11 are disposed such that the distance to the electrode pads 31 is as small as possible.

The two electrode pads 21 connected to the oscillator circuit 11 and the two electrode pads 31 of the oscillating element 30 are respectively connected by wires 41. Each of the wires 41 is provided not to intersect with the wires 42 that connect the electrode pads 22 and the lead terminals 5. Namely, the electrode pads 21 are disposed at positions such that the wires 41 do not intersect with the wires 42. Namely, since the placement angle of each of the wires 41 changes depending on the arrangement of the respective electrode pad 21, the wires 41 can be configured not intersect with the wires 42 by setting the arrangement of the electrode pads 21. The arrangement of the electrode pads 21 may be determined such that the placement angles of the wires 41 substantially matches the placement angles of the wires 42, in other words, such that the wires 41 and the wires 42 are substantially parallel. Thus, determining the arrangement of the electrode pads 21 such that the wires 41 do not intersect with the wires 42 may prevent contact between the wires 41 and the wires 42.

Figure 3:
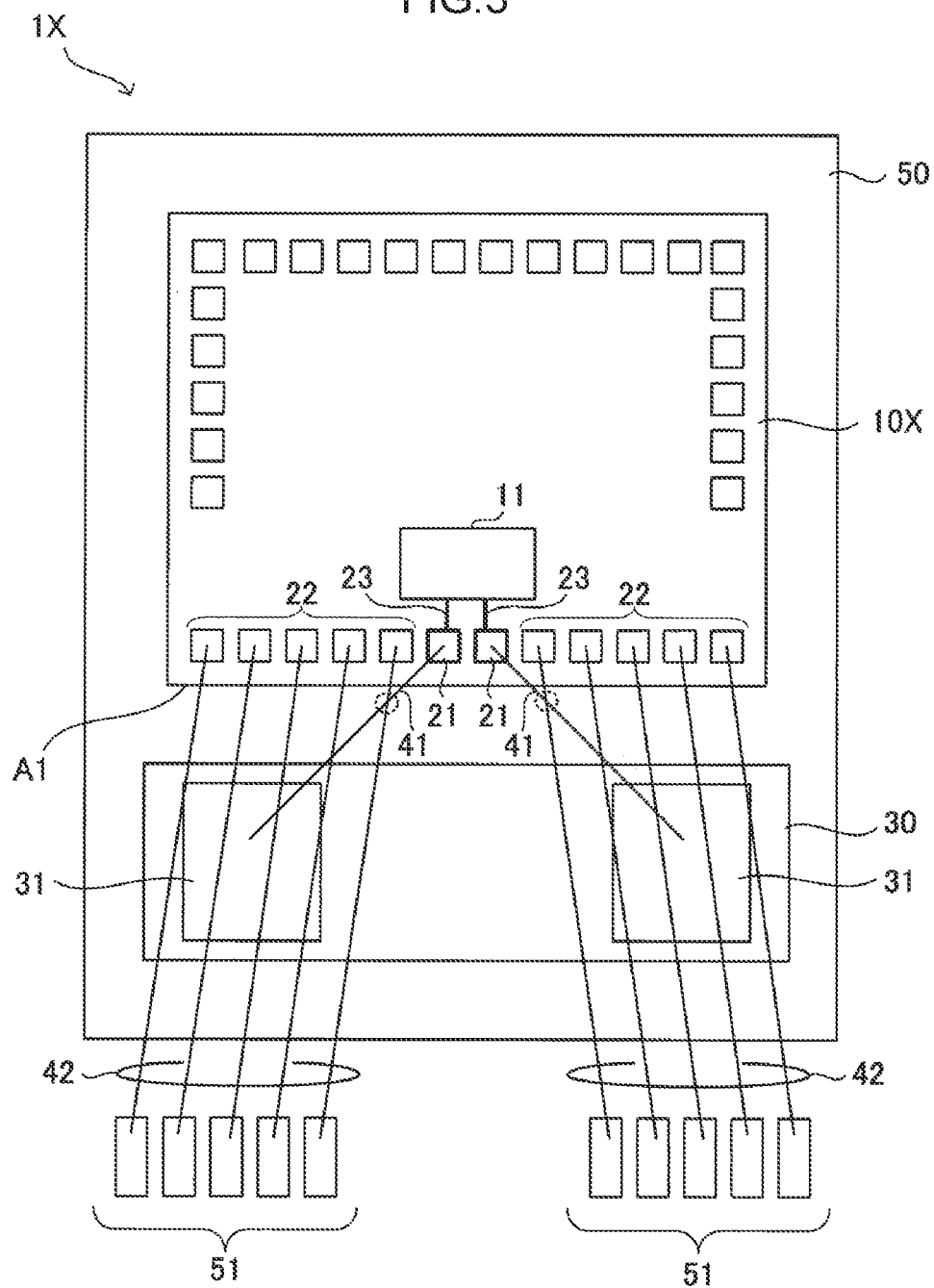
FIG. 3 is a plan view illustrating a configuration of a semiconductor device according to a comparative example.
Figure 4:
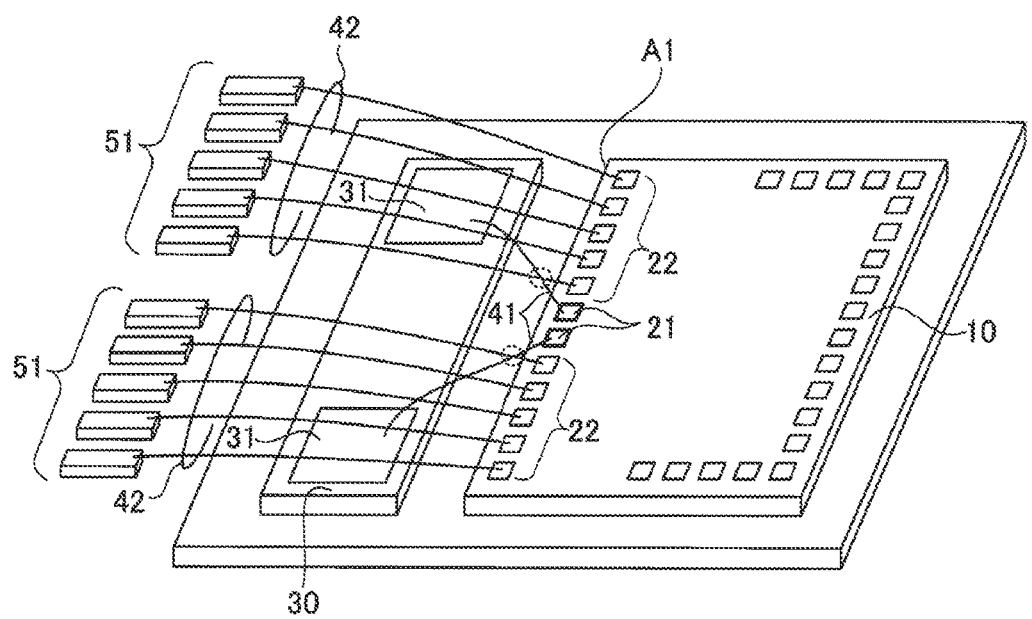
FIG. 4 is a perspective view illustrating a configuration of a semiconductor device according to a comparative example.

FIG. 3 is a plan view illustrating configuration of a semiconductor device 1X according to a comparative example, and FIG. 4 is a perspective view of the semiconductor device 1X according to the comparative example. Similarly to the semiconductor chip 10 according to the above exemplary embodiment, in the semiconductor device 1X according to the comparative example, a semiconductor chip 10X includes an oscillator circuit 11, two electrode pads 21 connected to the oscillator circuit 11, and plural electrode pads 22 not connected to the oscillator circuit 11.

In the semiconductor chip 10X according to the comparative example, the two electrode pads 21 connected to the oscillator circuit 11 are provided adjacent to each other and are provided in the vicinity of the oscillator circuit 11. Disposing the electrode pads 21 in the vicinity of the oscillator circuit 11 enables the length of the internal wiring 23 connecting the oscillator circuit 11 and the electrode pads 21 together to be made shorter than the length of the internal wiring 23 formed in the semiconductor chip 10 according to the exemplary embodiment of the present disclosure as illustrated in FIG. 1.

However, in cases in which the electrode pads 21 are disposed in the vicinity of the oscillator circuit 11, as illustrated in FIG. 3 and FIG. 4, the placement angle of the wires 41 connecting the electrode pads 21 and the electrode pads 31 of the oscillating element 30 becomes larger than the placement angles of the wires 42 connecting the electrode pads 22 and the lead terminals 51. As a result, for example, there is a concern that contact between the wires 41 and the wires 42 will occur at the portion enclosed by the dashed lines in FIG. 3. In cases in which the distance between the electrode pads 21 and the electrode pads 22 is sufficiently long, contact between the wires 41 and the wires 42 in the semiconductor chip 10X may be avoided. However, it is not always possible for the distance between the electrode pads 21 and the electrode pads 22 to be made sufficiently long while securing the required number of electrode pads 22. In such cases, the size of the semiconductor chip may need to be increased.

On the other hand, the semiconductor chip 10 according to the present exemplary embodiment is not configured so as to preferentially dispose the electrode pads 21 to be adjacent to each other, and is not configured so as to preferentially dispose the electrode pads 21 in the vicinity of the oscillator circuit 11. Namely, in the semiconductor chip 10, the electrode pads 21 connected to the oscillator circuit 11 are disposed such that the wires 41 and the wires 42 do not intersect, the electrode pads 21 are disposed at positions spaced apart from each other, and the electrode pads 21 are disposed at positions relatively far from the oscillator circuit 11. Thus, by determining the arrangement of the electrode pads 21 such that the wires 41 and the wires 42 do not intersect with each other, the present exemplary embodiment may prevent contact between the wires 41 and the wires 42.

In the semiconductor chip 10 according to the exemplary embodiment of the present disclosure, the length of the internal wiring 23 is set longer than that in the semiconductor chip 10X according to the comparative example, since the electrode pads 21 are disposed at positions relatively far from the oscillator circuit 11. In the semiconductor chip 10 according to the present exemplary embodiment, the internal wiring 23 configures a wiring layout that passes through the region between the electrode pads 21 and 22 and the edge A1 of the semiconductor chip 10, namely, that passes through the outer peripheral region of the semiconductor chip 10. Namely, the internal wiring 23 does not configure a wiring layout that connects the electrode pads 21 and the oscillator circuit 11 by the shortest routes. Rather, the internal wiring 23 configures a wiring layout that is diverted along the edge A1 side of the semiconductor chip 10. By configuring the wiring layout of the internal wiring 23 in such manner, the present exemplary embodiment may avoid interference between the internal wiring 23 and other wiring formed in the semiconductor chip 10, and may simplify the arrangement of other wiring.

Moreover, in the semiconductor chip 10 according to the present exemplary embodiment, since the electrode pads 21 are not preferentially disposed in the vicinity of the oscillator circuit 11, there are fewer restrictions regarding the arrangement of the oscillator circuit 11, and the degree of freedom for arrangement of the oscillator circuit 11 and other circuitry formed in the semiconductor chip 10 may be increased.

Moreover, with the semiconductor device 1 according to the present exemplary embodiment, the two electrode pads 21 connected to the oscillator circuit 11 are each provided within the region R which is a region between the edge B1 extension line and the edge B2 extension line of the respective electrode pad 31. This enables the length of the wires 41 connecting the electrode pads 21 and the electrode pads 31 to be made shorter than the length of the wires 41 in the semiconductor device 1X according to the comparative example. Accordingly, the present exemplary embodiment may prevent contact between the wires 41 and the wires 42.

Second Exemplary Embodiment

Figure 5:
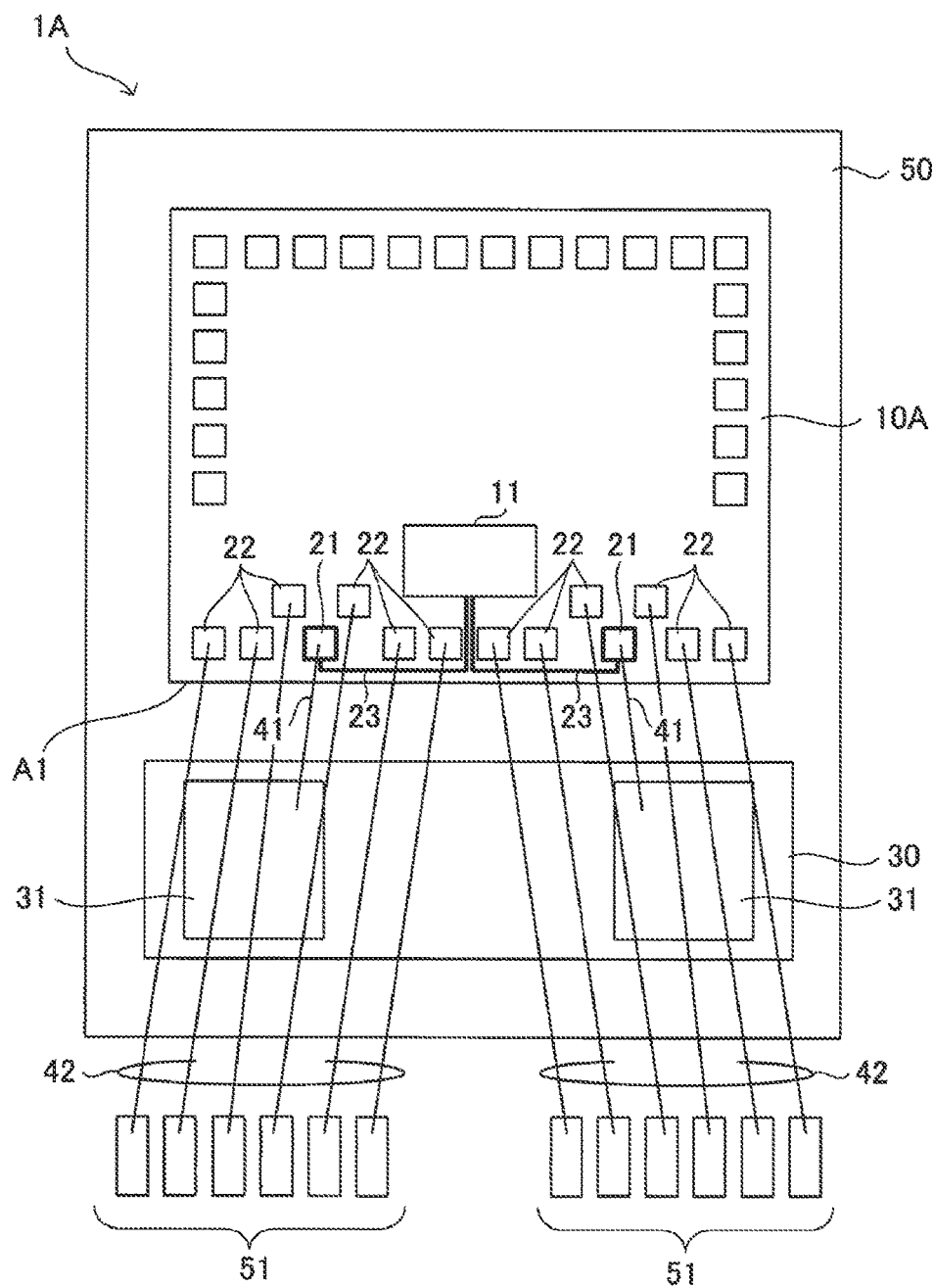
FIG. 5 is a plan view illustrating a configuration of a semiconductor device according to another exemplary embodiment of the present disclosure.

FIG. 5 is a plan view illustrating configuration of a semiconductor device 1A according to a second exemplary embodiment of the present disclosure. In a semiconductor chip 10A configuring the semiconductor device 1A, plural electrode pads, including electrode pads 21 connected to the oscillator circuit 11 and electrode pads 22 not connected to the oscillator circuit 11, are disposed forming plural rows running along the edge A1 forming an outer periphery of the semiconductor chip 10A. In the example illustrated in FIG. 5, the two electrode pads 21 connected to the oscillator circuit 11 and some of the plural electrode pads 22 not connected to the oscillator circuit 11 are arrayed at an outside (a side closest to the edge A1), and others of the plural electrode pads 22 not connected to the oscillator circuit 11 are arrayed at an inside (a side furthest from the edge A1).

Each of the electrode pads 21 is connected to an electrode pad 31 of the oscillating element 30 by a wire 41, and each of the electrode pads 22 is connected to a corresponding lead terminal 51 by a wire 42. Similarly to the semiconductor device 1 according to the first exemplary embodiment, the electrode pads 21 are disposed at positions such that the wires 41 do not intersect with the wires 42. Accordingly, the above configuration may prevent contact between the wires 41 and the wires 42 to be prevented.

Moreover, the semiconductor device 1A and the semiconductor chip 10A according to the present exemplary embodiment are configured with a layout in which the plural electrode pads, which includes both the electrode pads 21 and the electrode pads 22, are disposed so as to form plural rows running along the edge A1 of the semiconductor chip 10A. Accordingly, the present exemplary embodiment may the number of electrode pads disposed running along the edge A1 to be increased, compared to the semiconductor chip 10 according to the first exemplary embodiment.

Note that, in each of the above exemplary embodiments, cases in which the oscillating element 30 was given as an example of electronic components packaged with the semiconductor chip 10, 10A, and a case in which the semiconductor chip 10, 10A includes the oscillator circuit 11 connected to the oscillating element 30, have been described. However, the present disclosure is not limited thereto. The electronic components packaged with the semiconductor chip 10, 10A may be, for example, electronic components other than an oscillating element, such as another semiconductor chip differing from the semiconductor chip 10, 10A or a chip capacitor. In addition, the circuit formed on the semiconductor chip 10, 10A may be a circuit other than an oscillator circuit, such as a power supply circuit or an input/output circuit connected to electronic components. Moreover, in the above exemplary embodiments, cases in which two electrode pads 21 and two wires 41 for connecting the semiconductor chip 10, 10A and the electronic components (the oscillating element 30) are provided, have been described. However, there may be one or three or more electrode pads and wires for connecting the semiconductor chip and the electronic components.

Further, in each of the above exemplary embodiments, cases in which the semiconductor chip 10, 10A and the oscillating element 30 are mounted on a lead frame, have been described. However, a wiring substrate such as a printed circuit board may be employed instead of a lead frame. In such a case, the electrode pads formed on the wiring substrate may function as the lead terminals 51.

What is claimed is:

1. A semiconductor device comprising:
    a semiconductor chip having a rectangular external profile and including a circuit having a predetermined function, at least one first terminal connected to the circuit, and a plurality of second terminals not connected to the circuit, the at least one first terminal and the plurality of second terminals being formed adjacent to a first edge of the semiconductor chip forming an outer periphery of the rectangular external profile and being arrayed linearly and parallel to the first edge;
    a plurality of third terminals provided at positions outside of the semiconductor chip and opposing the first edge, the plurality of third terminals connected to respective ones of the plurality of second terminals by respective first wires; and
    an electronic component provided between the semiconductor chip and the third terminals, the electronic component including a fourth terminal connected to the at least one first terminal by a second wire and disposed below some of the first wires,
    wherein the at least one first terminal is disposed at a position such that the first wires and the second wire do not intersect, and wherein the semiconductor chip includes internal wiring that connects the circuit and the at least one first terminal and that runs through a region between the first edge of the semiconductor chip, and the at least one first terminal and the plurality of second terminals arrayed linearly.

2. The semiconductor device of claim 1, wherein the at least one first terminal is provided at a position that overlaps with the fourth terminal along the first edge of the semiconductor chip.

3. The semiconductor device of claim 1, wherein
the at least one first terminal includes two first terminals spaced apart from each other along the first edge of the semiconductor chip;
the electronic component includes another fourth terminal, the fourth terminal and the another fourth terminal are respectively connected to the two first terminals by the second wire and another second wire, and the fourth terminal and the another fourth terminal are spaced apart from each other along the first edge of the semiconductor chip; and
at least some of the plurality of second terminals are disposed between the two first terminals.

4. The semiconductor device of claim 1, wherein the semiconductor chip includes a first terminal row including the at least one first terminal and the plurality of second terminals that are arrayed linearly in parallel with the first edge of the semiconductor chip, and a plurality of terminal rows that include a plurality of additional second terminals and that are arrayed linearly in parallel with the first terminal row.

5. The semiconductor device of claim 1, wherein:
the electronic component is an oscillating element; and
the circuit is an oscillator circuit connected to the oscillating element by the second wire.

6. The semiconductor device of claim 1, wherein each of the plurality of third terminals are lead terminals configuring a lead frame.

7. A semiconductor chip having a rectangular external profile, the semiconductor chip comprising:
an oscillator circuit;
a plurality of terminals provided adjacent to a first edge forming an outer periphery of the semiconductor chip and arrayed linearly and parallel to the first edge; and
internal wiring that connects one of the plurality of terminals with the oscillator circuit and that runs through a region between the first edge of the semiconductor chip, and the plurality of terminals arrayed linearly.

8. The semiconductor chip of claim 7, wherein
two terminals from among the plurality of terminals are connected to the oscillator circuit by the internal wiring, and
at least one terminal from among the plurality of terminals that is not connected to the oscillator circuit is disposed between the two terminals connected to the oscillator circuit.

* * * * *